United States Patent [19]
Sutton, Jr.

[11] 3,751,163
[45] Aug. 7, 1973

[54] STEP AND REPEAT APPARATUS WITH GAS BEARING SUSPENSION

[75] Inventor: William J. Sutton, Jr., Vestal, N.Y.

[73] Assignee: International Business Machines Corporation, Armonk, N.Y.

[22] Filed: Feb. 24, 1972

[21] Appl. No.: 228,847

[52] U.S. Cl. .......... 355/87, 355/92, 355/133
[51] Int. Cl. .......... G03b 27/20
[58] Field of Search .......... 355/87, 86, 92, 91, 355/133

[56] References Cited

UNITED STATES PATENTS 3,204,544 9/1965 Shannon .......... 355/133

*Primary Examiner*—Richard L. Moses
*Attorney*—K. P. Johnson et al.

[57] ABSTRACT

Apparatus for step and repeat exposure of a photosensitive plate which eliminates the necessity of removing the exposure head from the plate during stepping and thereafter repositioning the head for the next exposure. The exposure head has a planar bearing surface for movement adjacent the photosensitive plate and a curved bearing surface for engagement with a complementarily curved bearing surface of the exposure head support. Both the planar and curved bearing surfaces are provided with gas films therebetween in order to practically eliminate friction and allowing omnidirectional movement of the exposure head relative to the support. The gas film provided at the planar bearing surface of the support head is used to maintain the support head out of contact with the photosensitive plate to thereby allow relative movement in either of two coordinate directions parallel with the plate. This construction permits the exposure head to accommodate variations in the thickness of the photosensitive plate during movement under the head.

11 Claims, 6 Drawing Figures

STEP AND REPEAT APPARATUS WITH GAS BEARING SUSPENSION

BACKGROUND OF THE INVENTION

In the field of printed circuit manufacture, highly accurate exposure of photosensitive emulsions and photoresist is required in order to produce production masks, conductors or components required for the ultimate circuits. Contact or near-contact exposure is generally used for generating production glass masks or circuit panels for circuit cards and boards. Near-contact printing is preferred because neither the master or production image masks are inadvertently damaged or worn.

Since processing is more efficiently accomplished with large glass masks or panels, step and repeat exposure is an attractive method of proparing such masks. The same image is repetitively exposed several times on the large panel, and the panel subdivided after processing. Heretofore, step and repeat exposure has necessitated careful positioning of the exposure head with its image mask less than one mil from the photosensitive surface, exposing, and then lifting of the image mask from the exposure position. The exposure head or photosensitive plate is then moved to a new position for careful repositioning of the image mask. The movemment of the exposure head, carrying its image mask between the exposure positions and raised positions, has required significant time and complex positioning mechanisms in order to achieve the required accuracy in location and spacing.

The reason for raising the exposure head prior to any lateral movement relative to the photosensitive plate was that the emulsion or plate could be damaged by actual contact thereby producing an imperfect reproduction of the image. Usually dust particles at the close exposure distance or variations in plate thickness would result in emulsion damage by actual contact. The frequent repositioning of the exposure head close to the plate also increased the likelihood of damage.

It is accordingly a primary object of this invention to provide an exposure head for step and repeat cameras which can permit lateral relative movement over a photosensitive plate without need for the usual lifting and repositioning at each exposure site.

A further object of this invention is to provide an exposure head which can be tilted in all the required directions to accommodate the unevenness of the exposed plate, such tilting being accomplished with a minimum of friction to thereby avoid possible contact with the plate and enable accurate positioning.

Another object is to provide an exposure head for step and repeat camera which is capable of maintaining a highly reliable and yet minimum distance between the image mask and sensitized plate.

A still further object of this invention is to provide apparatus in an exposure head which facilitates easy changing of the image mask within an exposure head or easy changing of the head itself.

SUMMARY OF THE INVENTION

The foregoing objects are accomplished in accordance with the invention through the provision of an exposure head which is supported on a photosensitized plate by a gas film and also held in its own support by another gas film thus resulting in the elimination of nearly all friction in required movement. There is provided an arcuate bearing surface between the support for the exposure head and exposure head itself which provides a modified-ball-and-socket joint thus allowing angular movement of the head relative to its support for self-alignment. At the arcuate bearing surfaces resilient clamping devices restrict any angular motion of the head relative to its support. The resilient mounting however, maintains the required stability of the head while the plate to be exposed is moved laterally thereunder. By providing a gas film between the head and photographic plate and between the support for the head and the head itself, minimum friction is attained so that the head is essentially free to move as indicated by the thickness of the gas film at the plate.

The exposure head and its support have several important features that make their use attractive and desirable. For example, the image mask is held in place in the exposure head by evacuated channels in a frame at the mask perimeter and the frame is movable to accommodate image glass of varying or irregular thickness so that the mask surface adjacent the photosensitive plate can be held in alignment with the exposure head margin surfaces. The exposure head is supported by a pneumatic cylinder which can be pressurized to any desirable value to thereby control the weight of the head accommodated by the gas film at the mask-plate interface. The pneumatic support also facilitates lifting the exposure head from the plate surface when image masks are to be changed or in the event the exposure head is to be replaced. Several exposure heads of different sizes may be used with the same support mounting by requiring only that the arcuate bearing surfaces be generated on a radius complementary to that of the support mechanism for the head. Individual gas bearings are provided near the perimeter of the head on the planar surface to thereby maintain better control and stability. With this design, the head can be used with an edge off the photosensitive glass since others of the plurality of gas bearings will provide satisfactory support. Either constant pressure or constant flow gas bearings can be used throughout the bearing surfaces to accomplish this. A constant film thickness is highly desirable.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
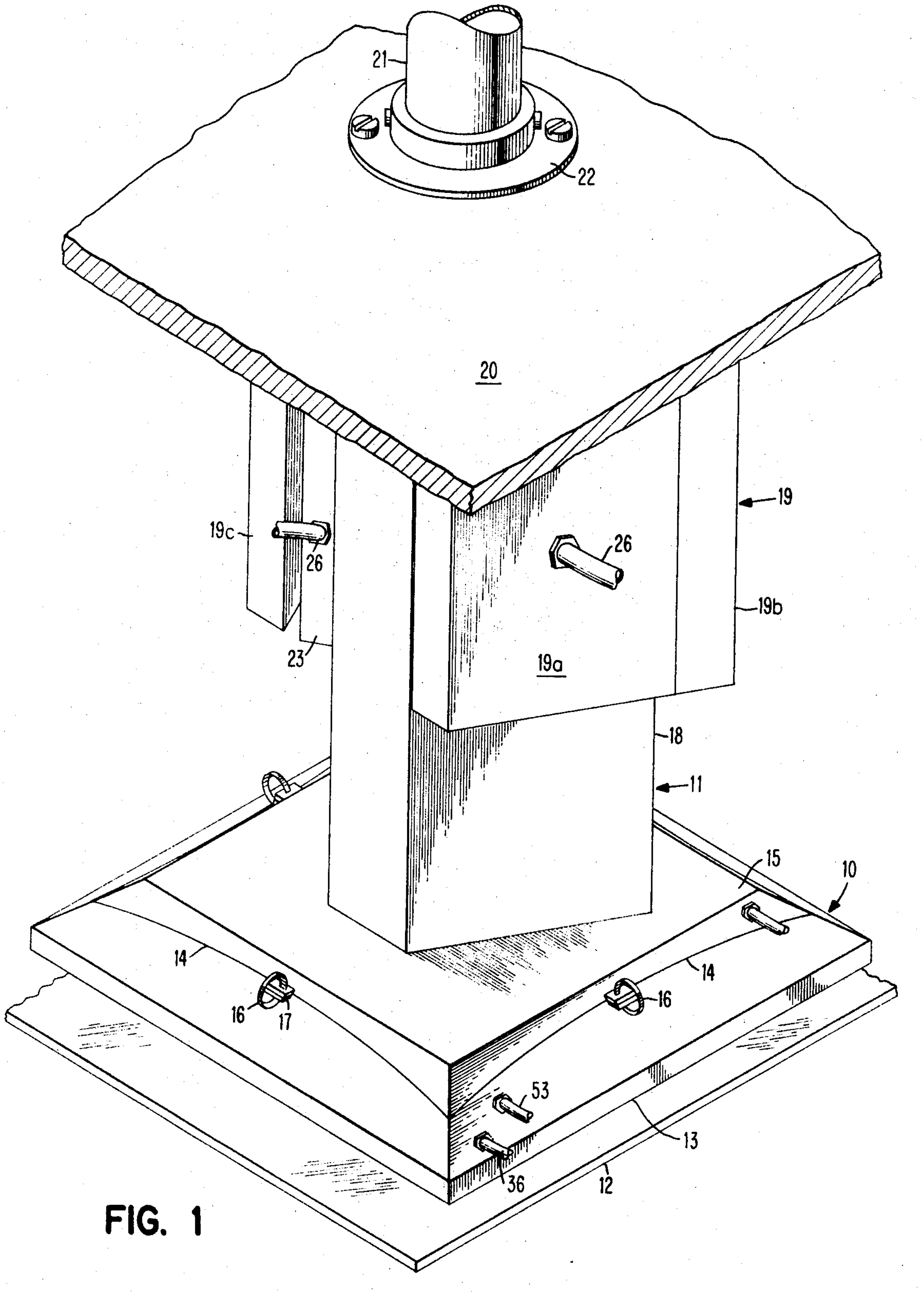
FIG. 1 is a perspective view of an exposure head and its support mechanism constructed in accordance with the principles of the invention.

Referring to FIG. 1, the apparatus suitable for step and repeat exposure of relatively large photosensitive plates is comprised of an exposure head portion, indicated generally as 10 suspended from a columnar support mechanism indicated generally as 11. The support mechanism is rigidly secured to the fixed members (not shown) which are positioned above the planar photosensitive plate 12 which is to be exposed. The bottom surface 13 of the exposure head is correspondingly planar and is shown in FIG. 1 as having a square configuration, although other configurations can be used. Head 10 on its surface adjacent its support mechanism is formed with an arcuate bearing surface as indicated by the curved junction lines 14. Base 15 of the support mechanism 11 is formed with a complementary arcuate surface so that the exposure head and base can move relatively in any direction necessary, as in a ball-and-socket joint, so that the head conforms with the variations in the upper planar surface of plate 12 during relative motion between the head and the plate.

Head 10 is held attached to base 15 by resilient clamping means such as C-shaped clamps 16 engaging a pair of grooved blocks 17 one of which is on each of the base and the exposure head. A clamp and pair of grooved blocks are provided on each of the four sides of the exposure apparatus. Although not required, the exposure head 10 and base 15 are in the shape of a truncated pyramid so as to reduce the size of the support mechanism 11 while permitting a larger image mask (not shown) to be used within exposure head 10.

Base 15 is, in turn, attached to column 18 of trapazoidal cross-section that can move vertically within correspondingly hollow column 19 made up of individual elements **19*a*, 19*b*, and 19*c*. As will be seen later, this construction permits the support mechanism 11 to be closely restrained in its lateral movement. Column 19 is, in turn, attached to a plate 20 which is part of the superstructure of the table on which photosensitive plate 12 is supported and moved. Support plate 20 is formed with an aperture through which the piston rod of a pneumatic cylinder 21 can be attached to column 18. Cylinder 21 is attached to plate 20 through the use of flanged ring 22.**

Figure 2:
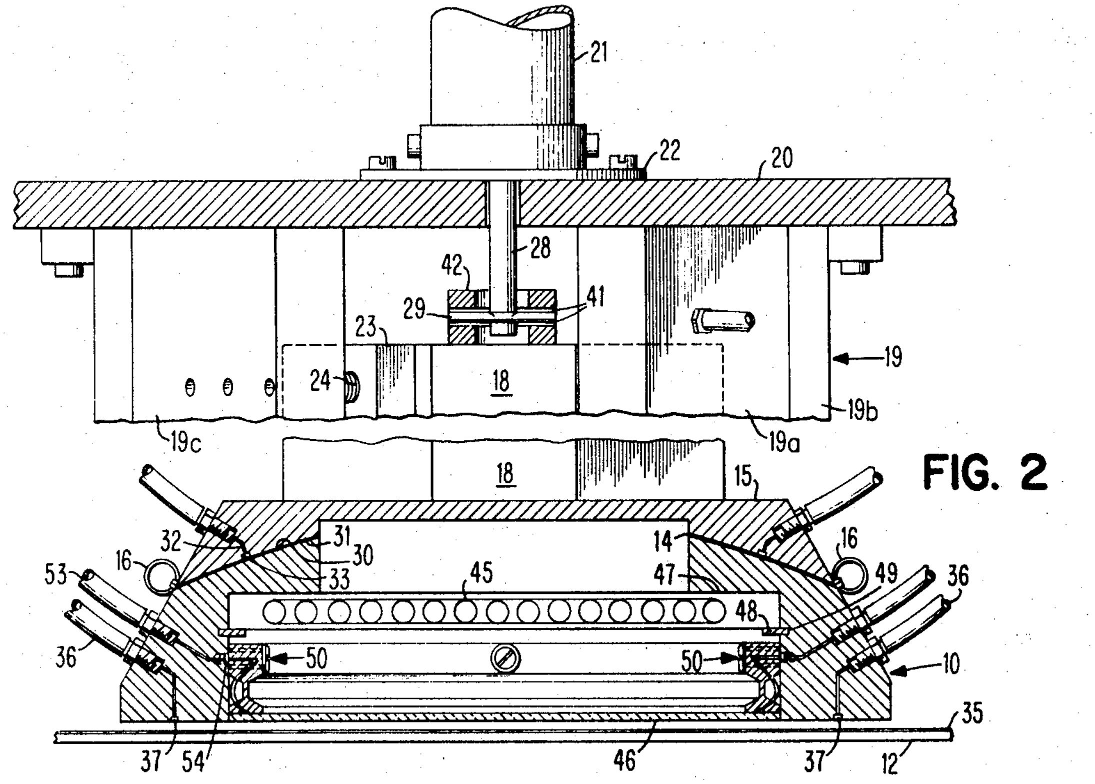
FIG. 2 is a sectional elevation view of the apparatus shown in FIG. 1.

The detailed relationship of the various elements of the exposure apparatus is shown more clearly in FIG. 2. From this figure, it can be seen that exposure head 10 has a curved upper bearing surface 30 which is complementary to curved bearing surface 31 of support base so that the bearing surfaces form a junction 14 as seen earlier in FIG. 1. The radius of these surfaces can vary according to design requirements, but is generally 12–18 inches. These bearing surfaces, however, are held out of actual contact with each other by a gas film which is supplied through a duct 32 to a recess 33 on each of the four sides of the exposure head. The gas supplied is usually air and is provided through constant flow or constant pressure regulating devices well known in the gas bearing art. The supply pressure is controlled to produce a separation along junction 14 at approximately 0.1 mil. This gas film counteracts the force applied through clamps 16 which are preferably made of a resilient material to permit such expansion. It will ne noted that the use of the clamps permits small amounts of lateral movement because of the rolling characteristic of the clamps on the tabs 17 affixed to the support base 15 and exposure head 10. The clamps, however, are effective to restrict head rotation relative to base 15.

Figure 3:
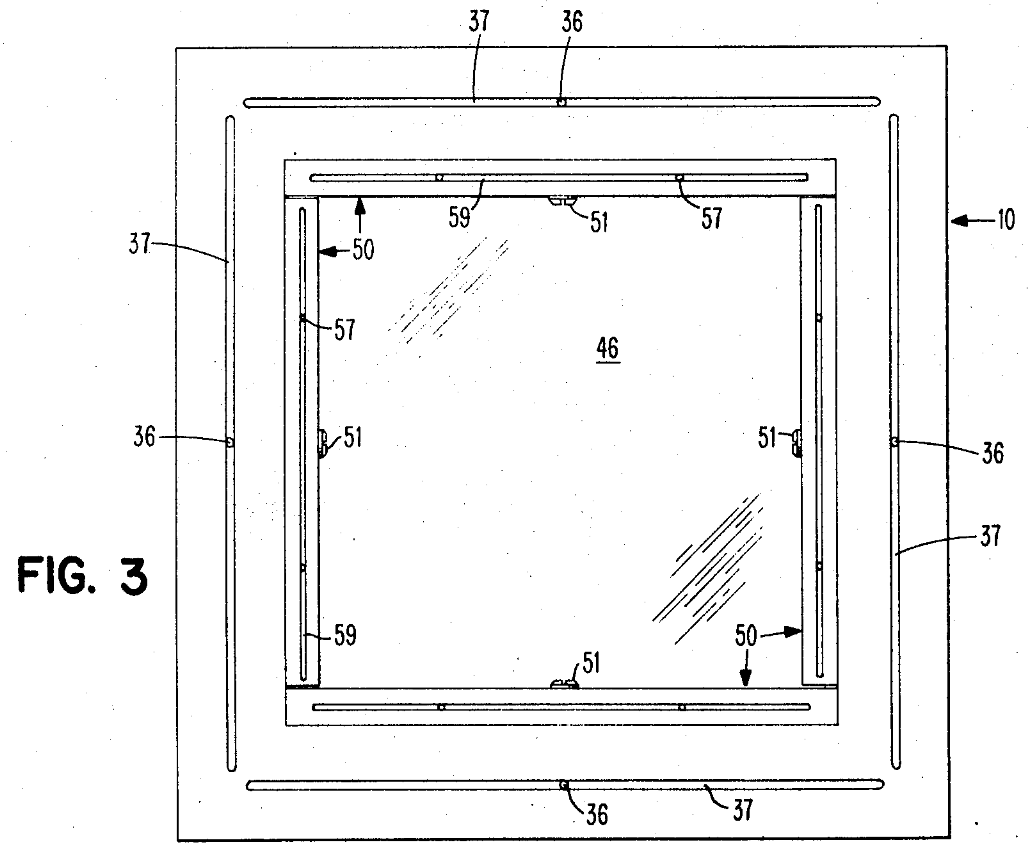
FIG. 3 is a bottom view of the exposure head showing the gas support bearings for the exposure head at the photosensigive plate and vacuum channels for retaining the image mask in place.

The lower surface 13 of exposure head 10 is planar to conform with the upper surface of plate 12 with its photosensitive emulsion or photoresist 35 coated thereon. Head 10 is supported above coating 35 by means of a gas film resulting from pressurized gas supplied through independent regulators and ducts 36 on each side of the head to recesses 37 in planar surface 13 at the bottom of head 10. Again, gas, usually nitrogen or air, is supplied through constant flow or pressure devices to maintain a uniform gas film between the surface 13 and emulsion 35. It will be noted from FIG. 3 that duct 36 communicates with recesses 37 approximately at the mid point and that four ducts 37 are provided, there being one for each side of the exposure head. The provision of independent recesses or channels 37 about the peripheral margin of the exposure head enables the exposure head to operate even when one of the recesses 37 has moved beyond the edge of the planar surface therebelow. Because of this, the exposure head can be used nearer the edges to expose a larger portion of the photosensitive plate.

Figures 4, 5, 6:
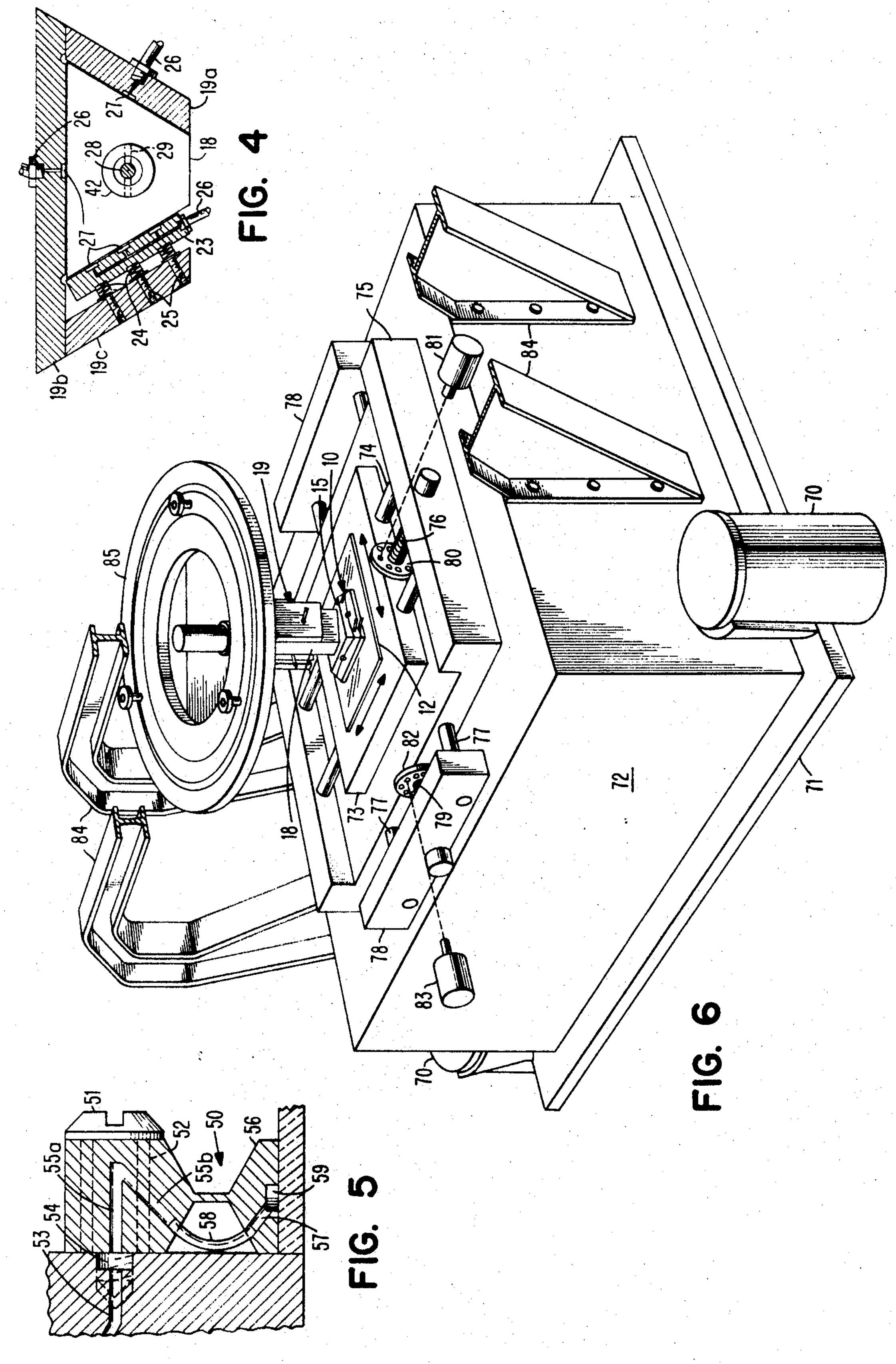
FIG. 4 is a sectional view of the support mechanism for the exposure head seen in FIG. 2.
FIG. 5 is a sectional view of the image mask support elements shown in FIG. 2.
FIG. 6 is a perspective view of the apparatus of FIG. 1 shown in conjunction with an X–Y positioning table and superstructure which may be used with the invention.

Referring again to FIG. 2, column 18 is vertically movable within hollow column 19 so that the former with attached exposure head 10 can be raised away from the photosensitive plate. Column 19, seen in cross-section in FIG. 4 is a composite of three elements **19*a*, 19*b*, and 19*c* secured together to provide a guideway for column 18. Elemental plates 19*a* and 19*b* form an acute corner to receive and locate column 18. A pad member 23 is resiliently supported on the inside surface of element 19*c* being parallel therewith and is urged against column 18 by springs 24. The springs are seated in suitable recesses 25 and adjusted as to compression by screws threadily held in element 19*c*. The springs against pad 23 force column 18 into an accurately formed "V" at the junction of elements 19*a* and 19*b*. These elements and pad 23 have ducts 26 that supply gas to grooves 27 along the surfaces abutting column 18 to provide gas bearing surfaces. Thus, column 18** can move vertically essentially without friction.

Column 18 is raised and lowered by movement of the piston in air cylinder 21 as shown in FIG. 2. The piston rod 28 has a cross pin 29 fixed therein which loosely fits two elongated slots 41 formed in a bracket 42 secured to the top of column 18. Normally, when the exposure head is down, the planar air bearing at the bottom of the head supports the combined weight of the head, base 15, and column 18. By forming slots 41 the piston rod pin 29 can be practically disengaged from the column so that column 18 is free to assume the level dictated by the arcuate and planar gas bearings below. The exposure head may be raised to its upper extreme for detachment of head 10 from its support base 15 by removal of the clamps and gas ducts connected to head 10. Easy removal is desirable in the event that a larger or smaller exposure head is required. If found desirable, the pressure in air cylinder 21 can be maintained at a value sufficient to apply a lifting force on column 18; this will permit adjustment of the load carried by the gas film at the emulsion surface.

Referring to FIG. 2, exposure of the photosensitive plate 12 is accomplished with the foregoing apparatus by directing light from source 45 through an image mask 46 held in a co-planar relationship with the bottom surface 13 of the exposure head. The light source shown is a serpentine tubular type such as that supplied by Aristo Grid Lamp Products Inc. of Port Washington North, New York. The particular lamp 45 conforms with the shape of the cavity 47 in the exposure head. Electrical connections to the lamp are not shown and can be either through the side of the head or downward from support plate 20 through column 18 to the top of the lamp fixture. Lamp 45 may be held in place by bars 48 removably secured in grooves 49 in the head. An alternate light source, of course, may be used for exposure such as a mercury arc which is mounted in base 15 or in column 18.

Image mask 46 is secured in position by vacuum attraction to elements 50 along each side of the opening which form a chase. Each support element 50 is somewhat similar in cross-section to an I-beam with a thin, flexible web and the element is held in approximate position by shoulder screws 51, seen also in FIG. 3. The screw passes through a hole 52 in each element and engages threads in the exposure head proper. Holes 52 are preferably of a larger diameter than that necessary to accept the threads so that there is clearance for each element to move up and down on its supporting screw 51. Each element 51 is connected to a source of vacuum through duct 53 which communicates with a recess 54 in each side wall of exposure head 10. As seen more easily in FIG. 5, recesses 54 are large enough to connect the vacuum supply with ducts 55*a* formed within the flange portion as the element 50 is moved to various positions on its supporting screws 51. The lower flange portion 56 of each element 50 is also provided with a duct 57, and tubing 58 connects ducts 55*b* and 57 to evacuate recesses 59 in the bottom of each element 50. As best seen in the FIG. 3, recess 59 extends the length of its particular element 50 and may be connected to vacuum through one or two or more of ducts 57. In order to load the image mask 46, the mask is placed on a flat planar surface and the head lowered sufficiently so that surface 13 of the head (FIG. 2) reaches the same level as the lower surface of mask 46, thus jointly forming a single planar surface. In the event that image mask 46 is thicker on one edge than along another, the vacuum elements 50 can move to accept the variation in thickness while still holding the lower surface of the mask at the proper level. This arrangement of separate elements 50 along each side of the exposure head recess 47, allows rapid, easy change of image masks and readily accepts variations in thickness of the masks to provide an accurate, uniform planar surface adjacent the emulsion 35 of the plate 12. The flexible web of each element 50 permits lower flange portion 56 to slightly move and accommodate some glass irregularities.

The exposure mechanism just described provides accurate positioning relative to the photosensitive plate 12 by relying on a gas film to support the head above the emulsion 35. By also providing a a gas film at the arcuate bearing surface 14 between bearing surface relative to its support head 10 and its support 15, low friction is provided to enable easy angular movement. The head can thereby conform with variations in thickness of the photosensitive plate 12 as either the head or plate are moved relative to each other.

FIG. 6 shows the exposure mechanism in conjunction with an X–Y positioning table. The exposure apparatus is supported on three pneumatic servos 70 which provide effctive isolation above one cycle per second. Attached to these mounts is a steel base plate 71 and on this base is a massive granite surface plate 72 which is supported on three recessed jack screws (not shown). The X–Y table drive stage of the system is referenced directly to the main granite base. Any number of drive arrangements could be used and, for purposes of illustration, there is shown the well-known lead screw type. The photosensitive plate 12 is positioned on an upper base plate 73 which is slidably mounted on guide rods 74 fixed in a U-shaped bottom plate 75. Conventional lead screw drive means 76 are provided to drive plate 73 in either direction along rods 74. Bottom plate 75 is slidably supported on rods 77 disposed at right angles to rods 74 and fixed between bracket numbers 78. Lead screw drive means 79 are provided to drive plate 75 in either direction along rods 77, plate 75 also carrying plate 73 with it. Mounted on lead screw 76 is a circular disk emitter 80 having holes around its periphery which are sensed by a photocell 81 and, in similar fashion, a circular disk emitter 82 and an associated photocell 83 are provided for lead screw 79. These photocells sense the feed of the lead screws and provide electrical output pulses which are used for synchronization and location purposes.

A large cast iron superstructure consisting of four identical castings 84 forms two continuous overhead beams directly attached to the sides of the main granite base. Attached to these beams is a large ring casting 85 that provides lateral stability and a mounting base for mounting plate 20 of the exposure head. Suitable Z-axis adjustable mounts on ring 85 are provided for tilt and vertical position.

Although the arcuate bearing surface has been shown as developed from along a radius from a point below the image plate, the arcuate surface may also be inverted in construction, if required. The construction shown, however, is preferred to minimize any positioning error.

While the invention has been particularly shown and described with reference to a preferred embodiment thereof, it will be understood by those skilled in tje art that the foregoing and other changes in form and details may be made therein without departing from the spirit and scope of the invention.

What is claimed is:

1. In apparatus for step and repeat exposure of a planar photosensitive plate, a device for supporting an image element in near-contact with said plate and for relative movement therebetween which comprises:

exposure head means for holding said image element substantially parallel to said plate, said exposure head means having a planar bearing surface adjacent said plate and an arcuate bearing surface opposite said planar surface;

means for supporting said exposure head means adjacent said plate and having an arcuate bearing surface complementary with said arcuate bearing surface of said exposure head means;

clamping means resiliently restricting relative motion between said exposure head means and said support means;

means for producing a gas film between said mating arcuate surfaces tending to counteract the clamp means to allow relative motion between said exposure head means and said support means; and means for producing a gas film separating said planar bearing surface from said plate when the same are in near-contact with each other.

2. In apparatus for step and repeat exposure of a planar photosensitive plate, the combination comprising:

first and second members forming an exposure head, said members having respective complementary concave and convex bearing surfaces so as to permit movement of one said member relative to the other, said first member also having a planar bearing surface for mating with said photosensitive plate;

clamping means resiliently restricting relative motion between said first and second members along their adjacent arcuate bearing surfaces;

first gas bearing means producing a gas film along said arcuate bearing surface and separating said members from actual contact;

second gas bearing means for separating said first member at its planar bearing surface and said photosensitive plate by a gas film when said first member is adjacent said plate; and means for supporting an image element within said first member in near-contact with said plate.

3. In apparatus for exposing a movable planar photosensitive plate with an image mask, the combination comprising:

a first member for holding said image mask, said first member having a planar bearing surface for support adjacent said plate and having opposite thereto an arcuate bearing surface;

a second member having an arcuate bearing surface complementary to that of said first member;

resilient clamping means for restricting relative angular motion between said first and second members along their said arcuate bearing surfaces;

first gas means for providing a gas film throughout said adjacent arcuate bearing surfaces of said members and counteracting said clamping means to permit relative omnidirectional movement of said members, and second gas means for providing a gas film between said planar bearing surface and said plate to prevent actual contact therebetween during relative movement of said plate and first member while maintaining a substantially constant separation gap.

4. Apparatus as described in claim 1 wherein said clamping means prevents relative angular motion between said carrier means and said support means.

5. Apparatus as described in claim 1 further comprising means for variably controlling the weight of said carrier means and said supporting means when supported by said gas film separating the said planar bearing surface and said plate.

6. Apparatus as described in claim 5 wherein said variable control means includes an air cylinder attached to said support means.

7. Apparatus as described in claim 1 wherein said carrier means includes an image mask having opaque and transparent areas therein and a source of radiant energy for illuminating said mask.

8. Apparatus as described in claim 7 further comprising chase-forming means for holding said image mask in position which includes means for attracting said mask to said holding means by vacuum.

9. Apparatus as described in claim 7 further comprising chase-forming means for holding said image mask which can be variably positioned relative to said carrier means.

10. Apparatus as described in claim 1 wherein said first gas bearing means includes a plurality of gas outlets to produce said film between said mating arcuate surfaces.

11. Apparatus as described in claim 1 wherein said second gas means includes a plurality of independent gas outlets, whereby said separation is maintained when one of said outlets in ineffective.

* * * * *